US011573534B2

(12) United States Patent
Jornod et al.

(10) Patent No.: US 11,573,534 B2
(45) Date of Patent: Feb. 7, 2023

(54) THERMOELECTRIC WATCH

(71) Applicant: The Swatch Group Research and Development Ltd, Marin (CH)

(72) Inventors: Alain Jornod, Neuchatel (CH); Francois Gueissaz, Cormondreche (CH); Yvan Ferri, Lausanne (CH)

(73) Assignee: The Swatch Group Research and Development Ltd, Marin (CH)

( * ) Notice: Subject to any disclaimer, the term of this patent is extended or adjusted under 35 U.S.C. 154(b) by 366 days.

(21) Appl. No.: 16/411,794

(22) Filed: May 14, 2019

(65) Prior Publication Data
US 2019/0369565 A1 Dec. 5, 2019

(30) Foreign Application Priority Data

Jun. 5, 2018 (EP) .................................... 18175994

(51) Int. Cl.
*G04C 10/00* (2006.01)
*H01L 35/08* (2006.01)

(52) U.S. Cl.
CPC .............. *G04C 10/00* (2013.01); *H01L 35/08* (2013.01)

(58) Field of Classification Search
CPC ........ H01L 35/08; G04G 19/10; G04G 17/04; G04C 3/008; G04C 10/00
See application file for complete search history.

(56) References Cited

U.S. PATENT DOCUMENTS

| 4,106,279 | A | 8/1978 | Martin et al. |
| 4,213,292 | A * | 7/1980 | Dolezal ................... G04C 10/00 320/101 |
| 5,889,735 | A | 3/1999 | Kawata et al. |
| 6,222,114 | B1 | 4/2001 | Mitamura |
| 6,316,714 | B1 | 11/2001 | Kotanagi et al. |
| 6,426,921 | B1 | 7/2002 | Mitamura |
| 6,560,167 | B1 | 5/2003 | Kotanagi |
| 7,234,859 | B2 * | 6/2007 | Kohler ................... G04B 31/04 368/326 |

(Continued)

FOREIGN PATENT DOCUMENTS

| CN | 1380994 A | 11/2002 |
| CN | 100389366 C | 5/2008 |

(Continued)

OTHER PUBLICATIONS

Huang, Yu et al., "Fabrication and thermal conductivity of copper coated graphite film/aluminum composites for effective thermal management", Journal of Alloys and Compounds 711 (2017), pp. 22-30. (Year: 2017).*

(Continued)

*Primary Examiner* — Tamir Ayad
(74) *Attorney, Agent, or Firm* — Oblon, McClelland, Maier & Neustadt, L.L.P.

(57) ABSTRACT

A thermoelectric watch including a thermoelectric module including a hot plate and a cold plate connected by semiconductor pillars, wherein the hot plate is thermally connected to the back cover of the watch, the cold plate is thermally connected to the case middle of the watch via a support element with at least two branches, at least two branches have a common end on which is held the cold plate of the thermoelectric module, and at least two branches are flexible to absorb shocks.

20 Claims, 6 Drawing Sheets

(56) References Cited

U.S. PATENT DOCUMENTS

| | | | |
|---|---|---|---|
| 2003/0007424 A1 | 1/2003 | Watanabe et al. | |
| 2006/0048809 A1* | 3/2006 | Onvural | H01L 35/04 |
| | | | 136/212 |
| 2017/0027803 A1* | 2/2017 | Agrawal | A61B 5/224 |
| 2017/0365766 A1 | 12/2017 | Boukai et al. | |

FOREIGN PATENT DOCUMENTS

| | | |
|---|---|---|
| EP | 1 001 318 A1 | 5/2000 |
| EP | 1 043 781 A1 | 10/2000 |
| EP | 1 227 315 A2 | 7/2002 |
| FR | 2 310 589 A1 | 12/1976 |
| JP | 8-46249 A | 2/1996 |
| JP | 11-242085 A | 9/1999 |
| JP | 2948205 B1 | 9/1999 |
| JP | 2009-98082 A | 4/2000 |
| JP | 4663208 B2 | 1/2011 |

OTHER PUBLICATIONS

Japanese Office Action dated Mar. 30, 2021 in Japanese Patent Application No. 2019-100959 (with English translation), 4 pages.
Combined Chinese Office Action and Search Report dated Sep. 1, 2020 in Chinese Patent Application No. 20190480974.7 (with English translation and English translation of Category of Cited Documents), 11 pages.
Japanese Office Action dated Jun. 30, 2020 in Patent Application No. 2019-100959 (with English translation), 5 pages.
European Search Report dated Nov. 28, 2018 in European Application 18175994.5, filed on Jun. 5, 2018 (with English translation of categories of Cited Documents and Written Opinion).

* cited by examiner

THERMOELECTRIC WATCH

CROSS-REFERENCE TO RELATED APPLICATION

This application claims priority to European Patent Application No. 18175994.5 filed on Jun. 5, 2018, the entire disclosure of which is hereby incorporated herein by reference.

FIELD OF THE INVENTION

The invention relates to the technical field of watches provided with a thermoelectric generator, called thermoelectric watches.

BACKGROUND OF THE INVENTION

Such a thermoelectric generator converts a heat flux into electrical power that can be used to power an electric device of the watch (watch movement, dial lighting device, etc.). Referring to FIG. 1, a thermoelectric generator GT includes, in a conventional manner, a thermoelectric module MT and an electric transmission circuit CT. Thermoelectric module MT includes a cold plate PF and a hot plate PC, which are electrically insulated, substantially parallel to each other and each carry electrically conductive wire connectors DMf, DMc disposed next to each other. Thermoelectric module MT also includes semiconductor pillars PS extending between wire connectors DMc of hot plate PC and wire connectors DMf of cold plate PF. Pillars PS are positioned such that each wire connector DMc of hot plate PC is connected to two wire connectors DMf of cold plate PF by a pair of semiconductor pillars PS comprising one n-doped semiconductor pillar and one p-doped semiconductor pillar, and each wire connector DMf of cold plate PF, except the two end ones DMfe, is connected to two wire connectors DMc of hot plate PC. Thus, pillars PS are connected electrically in series and thermally in parallel. Finally, electric transmission circuit CT connects the two end wire connectors DMfe of cold plate PF to the electric device to be powered.

In a conventional manner, the hot plate is thermally in series with the back cover of the watch and the cold plate is thermally in series with the case middle. When the hot plate is heated by transmission of natural heat released from the watch wearer's wrist, there is a difference in temperature between the hot plate and the cold plate. The temperature gradient results in an electric potential difference via the Seebeck effect between the wire connectors of the first plate and the wire connectors of the second plate. This electric potential difference is then communicated to the electric device to be powered via the electric transmission circuit. It is noted that the electric transmission circuit advantageously includes a voltage booster so that the thermoelectric generator can power the electric device even when the heat fluxes are low.

To maximise the temperature gradient, the thermoelectric module must be placed in optimal thermal contact with the back cover on the one hand, and with the case middle on the other. Referring to FIG. 2, this optimal thermal contact conventionally means maintaining pressure between back cover FD and thermoelectric module MT on the one hand, and between thermoelectric module MT and a support plate ES which is thermally and mechanically connected to case middle CR, on the other. However, with such a system, shocks to case middle CR easily propagate to thermoelectric module MT, which can cause deterioration of thermoelectric module MT whose hot and cold plates PC, PF are fragile.

SUMMARY OF THE INVENTION

To overcome this problem, there is proposed a watch according to claim 1.

Thus, it is proposed to provide the support element with at least two branches having a common end at which thermal contact occurs with the cold plate of the thermoelectric module; the other ends of the branches—called the second ends—are intended to be integral with the case middle. Owing to the flexible branches, the support elements acts as shock absorber, to prevent a shock to the case middle propagating to the thermoelectric module. The support element thus has the dual function of thermal conductor and mechanical spring with controlled stiffness. Since stiffness varies according to the product $ab^3$ and thermal conductance varies according to the product $ab$, where $a$ and $b$ are respectively the width and thickness of the branches, it is possible to optimise the thermal and mechanical parameters of the support element through careful choice of the dimensions $a$ and $b$ of the branches.

Further, the invention may include the characteristics defined in the dependent claims.

In one embodiment, the support element includes a metal ring that passes through the second ends of the branches, and the ring is fixed to the case middle such that the second ends are joined to the case middle via the ring. This therefore optimises attachment of the support element to the case middle. The support element ring is, for example, pressed and/or bonded onto the case middle.

The support element may or may not be in one piece. The branches may or may not be of the same length, so that the thermoelectric module is centred or off-centre with respect to the case middle. The support element may be made of only one material (aluminium, copper, CuBe, etc.) or an assembly of materials (including graphite, for example, which has high thermal conductivity).

In one embodiment, a bearing with high thermal conductivity and high mechanical damping is placed at the interface between the back cover and the thermoelectric module. In an embodiment which can be combined with that mentioned in the preceding sentence, a bearing with high thermal conductivity and high mechanical damping is placed at the interface between the thermoelectric module and the support element. The bearings can be formed of glass reinforced elastomer.

In one embodiment, the back cover includes:
 one part made of conductive material (for example aluminium, CuBe, etc.) arranged to be in contact with the wrist when the watch is worn and to direct the heat flux towards the thermoelectric module. Advantageously, on the wrist side, the surface of the conductive part covers most of the total back cover surface, but on the thermoelectric module side (i.e the side opposite the wrist side), the surface of the conductive part is hardly larger than the surface of the hot plate: thus there is a large heat flux removal surface but the flux is then concentrated exclusively towards the thermoelectric module.
 one part made of insulating material (for example ABS, polyamide, etc.) arranged to reduce the heat flux passing directly from the back cover of the watch to the case middle without passing through the thermoelectric module. The peripheral area of the insulating part is intended to be fixed to the case middle; the central area of the insulating part is covered by the conductive part on the wrist side.

The conductive and insulating parts can take various forms to optimise the conductive and insulating functions and to create decorative effects. The conductive part and the insulating part can be assembled by means of circlips on the thermoelectric module side, by crimping, by adhesive, etc.

In one embodiment, the insulating part is hollowed on the thermoelectric module side to reduce its thickness. More specifically, the central area of the insulating part is of smaller thickness than the peripheral area of the insulating part. The reason for this is that air is a better thermal insulator than any material that could form the insulating part (since, with such small dimensions, the air convection phenomena does not occur). It is also possible to envisage replacing air with another more insulating gas (for example argon, $CO_2$, or sulphur hexafluoride $SF_6$).

Likewise, the plate that carries the components to which the thermoelectric generator is connected may be hollowed to increase the volume of air (or gas) and thus improve thermal insulation between the back cover of the watch and the internal watch elements.

In one embodiment, to reinforce the insulating part which must be of small thickness for the aforementioned reasons, the conductive part on the wrist side or the insulating part on the thermoelectric module side includes stiff arms. The arms can be made of an identical or different material from the conductive and insulating parts.

In one embodiment, a disc acting as thermal radiation screen is arranged on the central area of the insulating part on the thermoelectric module side, to improve thermal insulation by preventing heat exchange by radiation. The material used as screen can be a material that has a low thermal emissivity at ambient temperature, such as spray, evaporation or paint deposited aluminium, etc. The radiation disc can alternatively be fabricated from materials deposited in several layers on a PET or other type of film, like survival blankets, and then added to the case back, with the gold side against the back cover. It is noted that the disc also acts as a Faraday cage, protecting the watch against electrostatic discharge.

In one embodiment, the mechanical stiffness K of the support element is within a range of between 0.15 N/mm and 2800 N/mm, preferably between 12.8 N/mm and 104.8 N/mm.

In one embodiment, the thermal conductance C of the support element is within a range of between 6.7 and 840 mW/K, preferably between 47 and 198 mW/K.

In one embodiment, the support element includes graphite-based films bonded to the branches and the films preferably have thermal conductivities of at least 400 W/m/K. The films increase the thermal conductance of the branches.

In one embodiment, the at least two branches are made of aluminium.

BRIEF DESCRIPTION OF THE DRAWINGS

Other features and advantages will appear clearly from the following description, given by way of non-limiting illustration, with reference to the annexed drawings, in which.

DETAILED DESCRIPTION OF PREFERRED EMBODIMENTS

Figure 1:
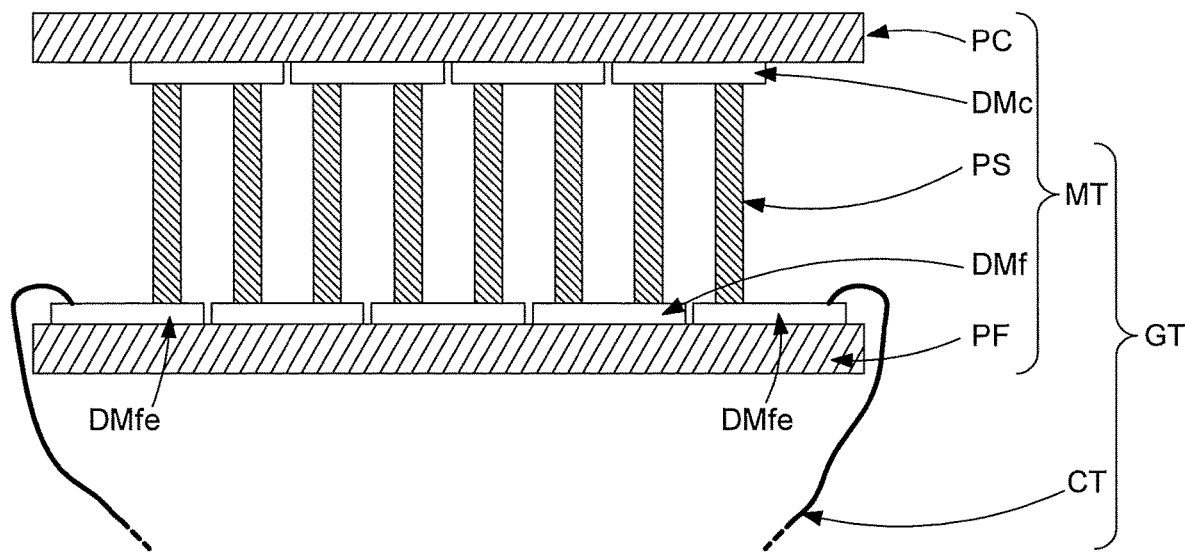
FIG. 1, described above, represents a thermoelectric generator which can be used to provide electric energy to a watch.
Figure 2:
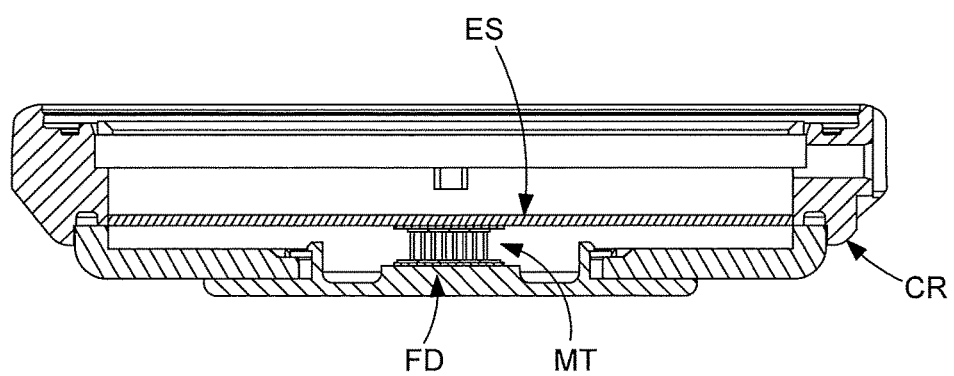
FIG. 2, described above, represents a module of the thermoelectric generator of FIG. 1, installed in the back cover of a watch.
Figure 3:
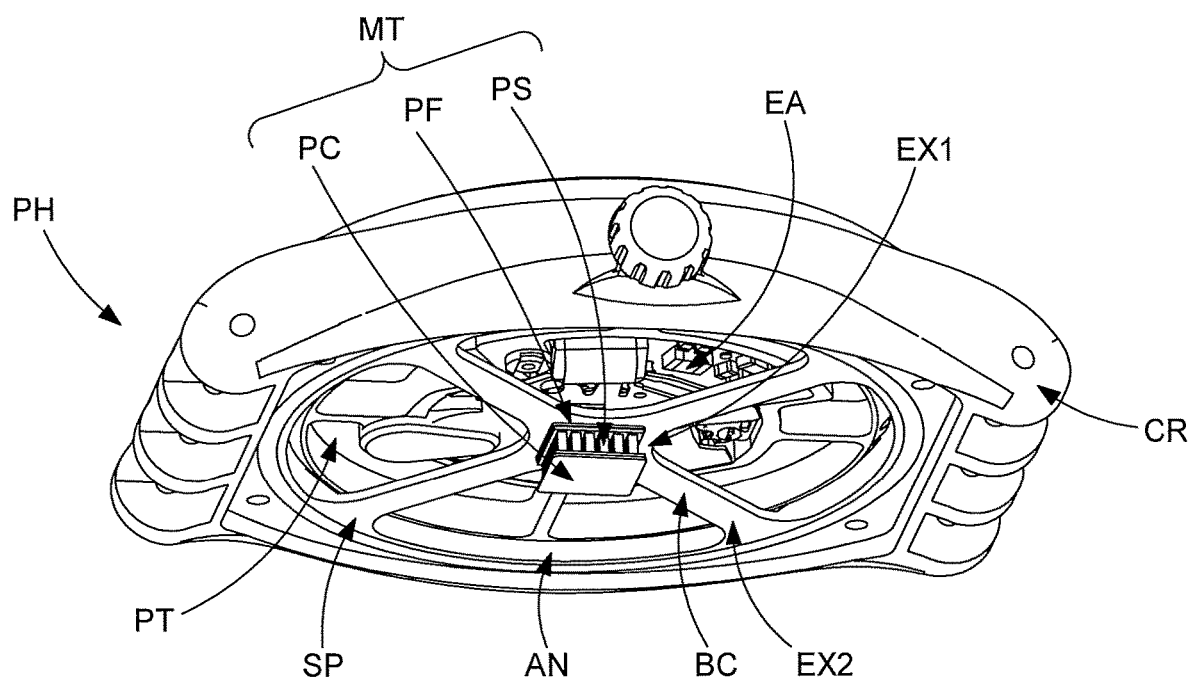
FIG. 3 represents a semi-exploded view of a thermoelectric watch according to one embodiment of the invention.
Figure 3:
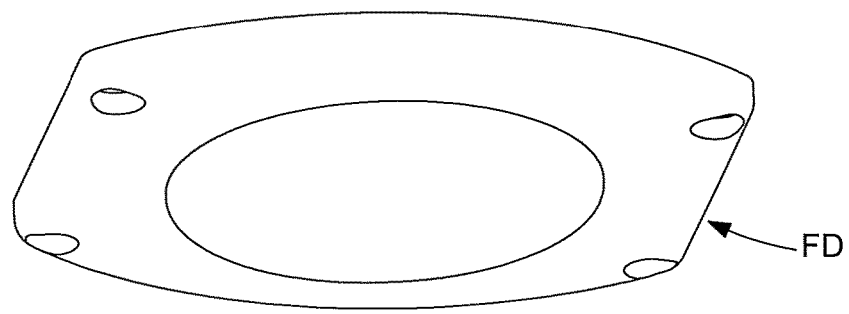

FIG. 3 is an exploded view of elements of a thermoelectric watch PH according to one embodiment of the invention. Watch PH includes:
a case middle CR
a plate PT installed in case middle CR
elements EA to be supplied with electrical energy and carried by plate PT
a back cover FD fixed to case middle CR
a thermoelectric generator including a thermoelectric module MT, said module MT comprising a hot plate PC, a cold plate PF, and semiconductor pillars PS extending between hot plate PC and cold plate PF
a support element SP mechanically connected to case middle CR between back cover FD and plate PT, thermoelectric module MT being disposed between support element SP and back cover FD.

Support element SP has the dual function of shock absorber (protecting the thermoelectric module from any shocks) and means for removing heat towards case middle CR.

Figure 4:
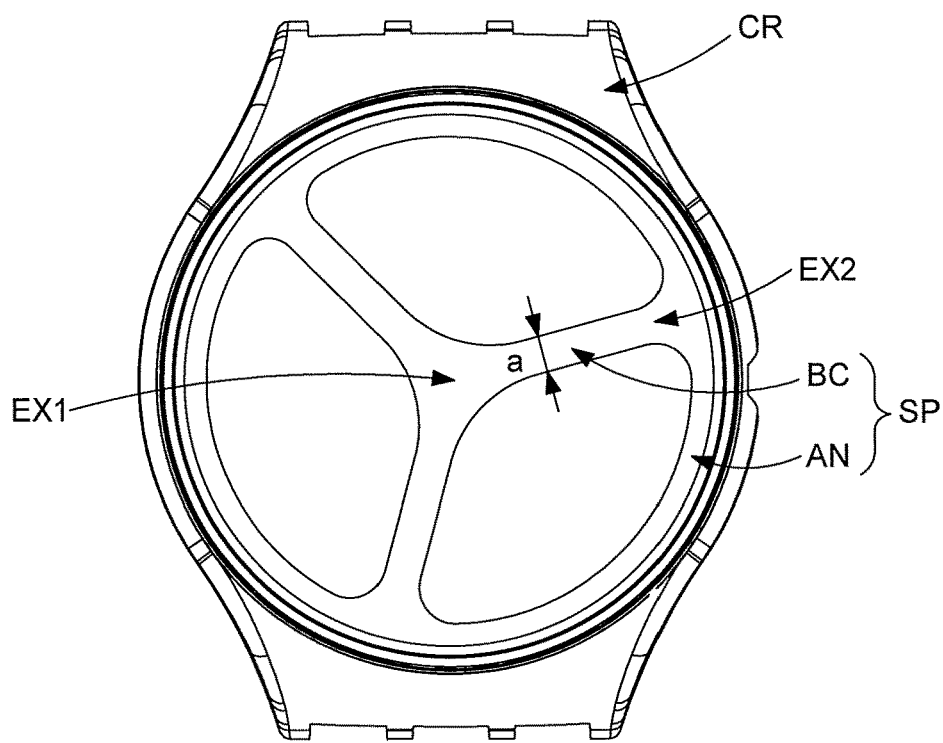
FIG. 4 represents a case middle and a support element of a thermoelectric module of a thermoelectric watch according to one embodiment of the invention.

Support element SP is formed of a ring AN and of a plurality of branches BC extending towards one another from ring AN. Thus, branches BC have a common end EX1 (at the centre of the ring in the case where the branches are all substantially of the same length, otherwise off-centre with respect to the ring). The other ends of the rings, called second ends EX2, are connected to ring AN. Said ring AN is fixed to case middle CR: ring AN is, for example, pressed and/or bonded and/or screwed and/or clipped onto case middle CR. Alternatively, it is possible to envisage support element SP not having a ring AN, and the two ends EX2 of the branches being directly fixed (for example bonded) to case middle CR. Ring AN does not need to be a good thermal conductor (a steel ring is sufficient), but branches BC must be: thus, they are advantageously made of copper, silver, gold, aluminium, or an alloy based on these materials. Moreover, in the embodiment of FIG. 3, there are four branches BC, but there could be more or fewer branches. FIG. 4 shows an embodiment wherein support element SP has three branches BC.

Branches BC are flexible to absorb shocks. Owing to their flexibility, the branches can deform in the event of shock. Furthermore, they conduct heat. The characteristic of the thermal conductance C of a support element with N identical branches of length l is given by the formula:

$$C = N * a * \frac{b}{l} * \lambda,$$

where a is the width, b the thickness of the N branches, and $\lambda$ the thermal conductivity of the material used. The mechanical stiffness K of the support element with N branches is given by the formula:

$$, K = N * E * a * \frac{b^3}{l^3},$$

where E is the modulus of elasticity of the material used.

Independently of each other, the parameters fall within the following ranges: N between 1 and 8, a between 2 and 10 mm, b between 0.2 and 1.0 mm and l between 10 and 25 mm. Depending on the damping sought, parameters are chosen to obtain a stiffness K falling within the range of between 0.15 N/mm and 2800 N/mm and a thermal conductance C between 6.7 and 840 mW/K.

Preferably N is chosen with 2 to 4 branches, a between 4 and 6 mm, b between 0.45 and 0.55 mm and l between 14 and 16 mm. Advantageously, it is sought to obtain a stiffness K of between 12.8 and 104.8 N/mm and a thermal conductance C of between 47 and 198 mW/K.

If a material like aluminium is chosen, with thermal conductivity $\lambda$=210 W/m/K and modulus of elasticity E=72 GPa, the thermal conductance C and mechanical stiffness can be adapted within a wide range by varying the parameters such as the number N of branches, and their dimensions a, b and l.

For example, for two branches, N=2, having the following dimensions: l=14 mm, a=5 mm and b=0.5 mm, there is obtained C=75 mW/K and K=32.8 N/mm. If so desired, the stiffness can be increased by around 20% while maintaining thermal conductance. To achieve this, the thickness b is increased by 10% and the width a is increased by 10% to obtain a=4.5 mm, b=0.55 mm, C=74 mW/K and K=39.3 N/mm.

To significantly improve thermal conductance along the branches, it is possible to bond to the branches graphite-based films having high thermal conductivities on the order of 400 W/m/K (for example, T62® by T-global®). A film of 0.13 mm thickness and 5 mm in width is bonded over the entire length l of the branches to add an additional conductance of 37 mW/K to that of a structure with 2 branches of width a=5 mm, of thickness b=0.50 mm and length l=14 mm, to obtain a conductance C of 112 mW/K instead of 75 mW/K.

Figure 5:
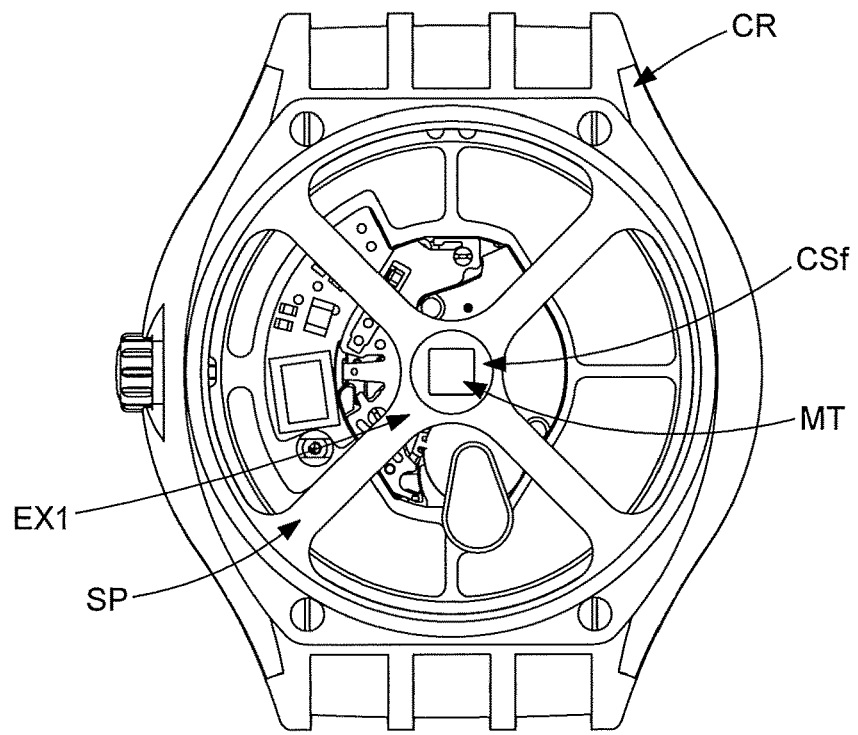
FIG. 5 represents a thermoelectric watch according to one embodiment of the invention, seen from the back cover side with the back cover removed.
Figure 7:
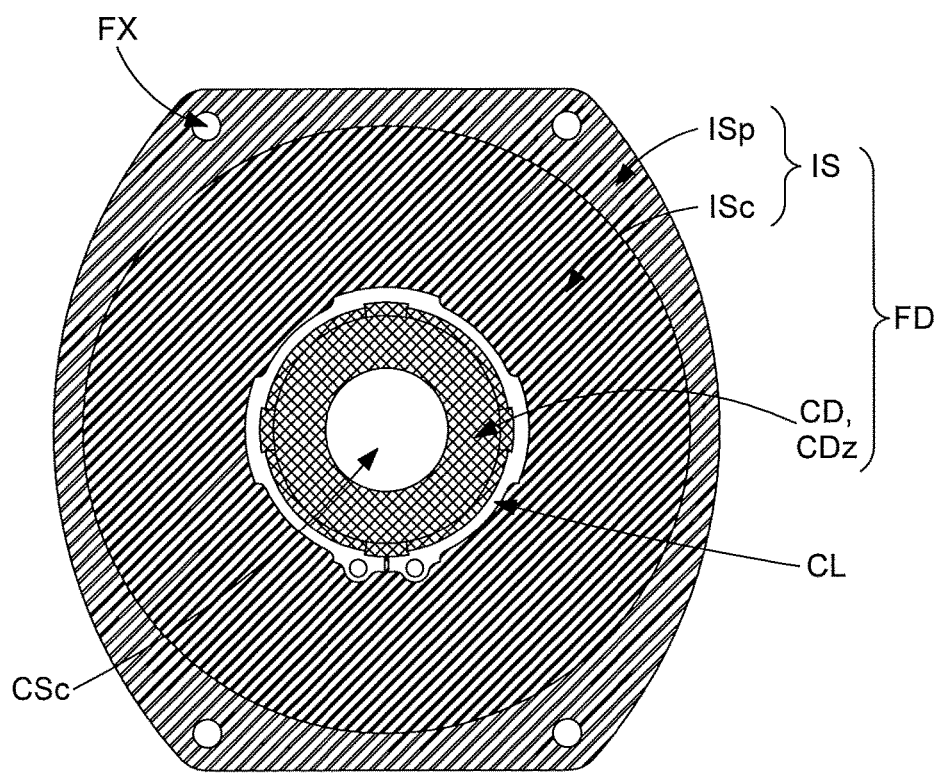
FIG. 7 represents a back cover of a thermoelectric watch according to one embodiment of the invention, seen from the thermoelectric module side.

Thermoelectric module MT is positioned at the common end EX1 of branches BC and cold plate PF is directly or indirectly in contact with said common end EX1. In the case where cold plate PF is indirectly in contact with common end EX1 of branches BC, a bearing Cf having high thermal conductivity and high mechanical damping is positioned between cold plate IDE and common end EX1, as seen in FIG. 5. As regards hot plate PC, it is also directly or indirectly in contact with back cover FD. In the case where hot plate PC is indirectly in contact with back cover FD, a bearing CSc with high thermal conductivity and high mechanical damping is positioned between hot plate PC and back cover FD; said bearing Sc is seen in FIG. 7. Bearings of this type can be made of elastomer reinforced with glass, carbon, graphite or diamond.

Figure 6:
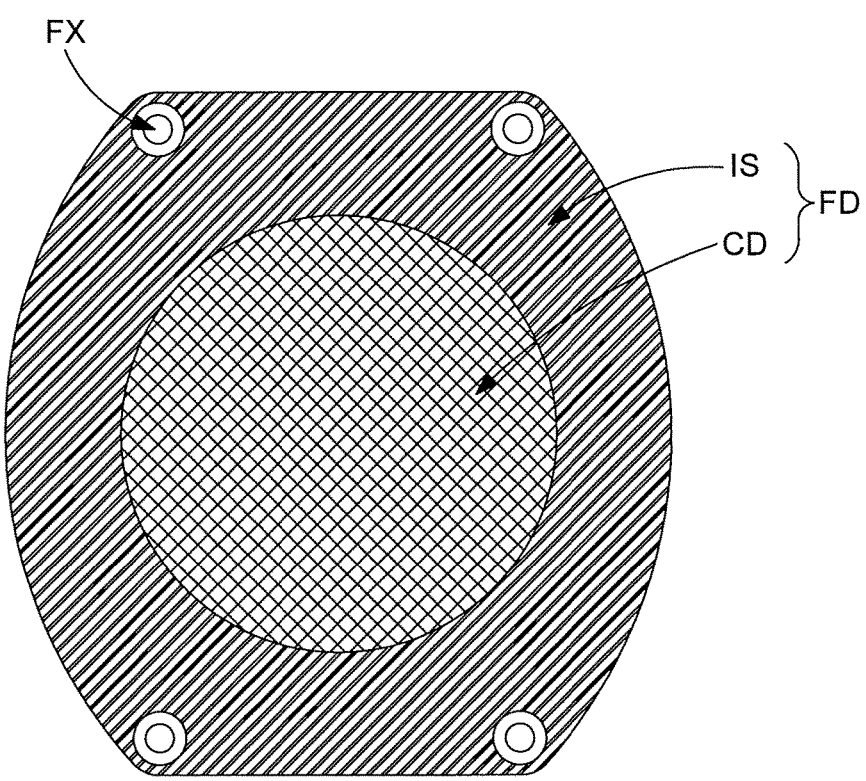
FIG. 6 represents a back cover of a thermoelectric watch according to one embodiment of the invention, seen from the wrist side.

As represented in FIGS. 6 and 7, back cover FD is formed of two parts: a central thermally conductive part CD and a thermally insulating part IS. Insulating part IS is itself formed of two areas: a central area ISc and a peripheral area ISp. On the wrist side (see FIG. 6), conductive part CD covers central area ISc of insulating part IS, and peripheral area ISp of insulating part IS surrounds conductive part CD. Further, central area ISc of insulating part IS includes a through opening (centred, in the embodiment of FIG. 7, but which could alternatively be off-centre, depending on the position of the thermoelectric module), making an area of conductive part CD, called contact area CDz, accessible from the thermoelectric module side. Contact area CDz is intended to be in direct or indirect contact with thermoelectric module MT. Thus, one side of conductive part CD is in contact with the wrist when the watch is worn, and the heat flux traverses conductive part CD and is brought to contact area CDz and directed across hot plate PC of thermoelectric module MT. Insulating part IS makes it possible to limit heat fluxes between the wrist and case middle CR of the watch that do not pass through thermoelectric module MT. In other words, the heat flux is forced to pass from back cover FD to case middle CR by passing through thermoelectric module MT.

In the embodiment of FIG. 7, conductive part CD is fixed to insulating part IS in contact area CDz, by means of a circlip CL. Alternatively, conductive part CD could be fixed to the insulating part at contact area CDz, by means of a crimping TS, as is the case of the embodiment shown in FIG. 9.

Figure 10:
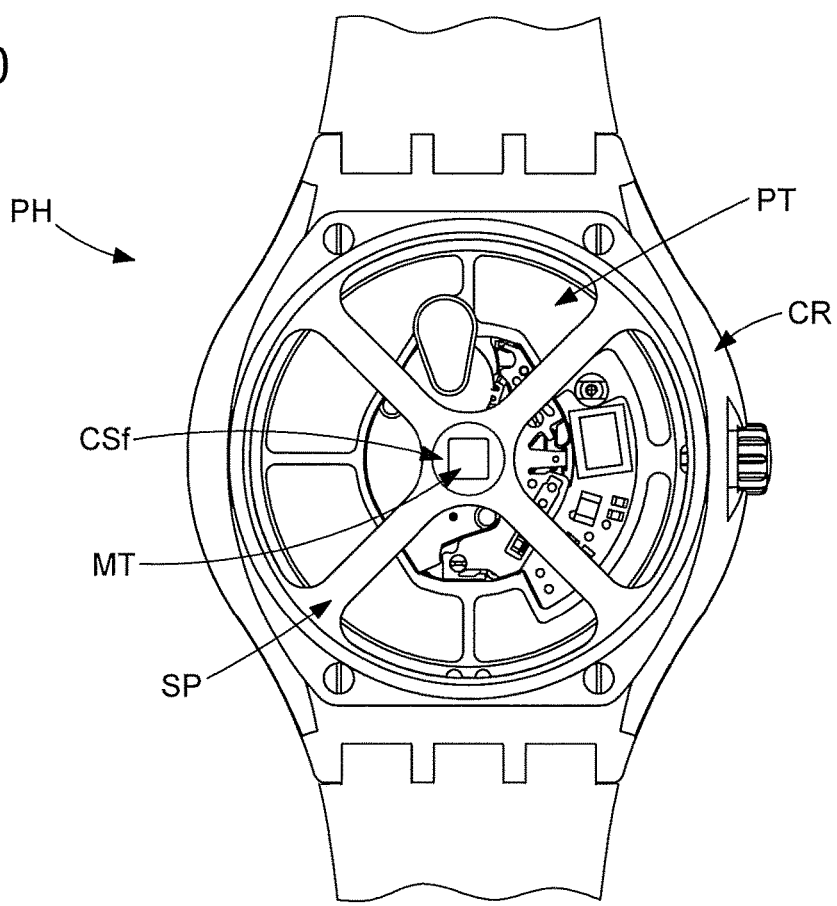
FIG. 10 represents a thermoelectric watch according to one embodiment of the invention, seen from the back cover side with the back cover removed.

It will also be noted that the thickness of central area ISc of insulating part IS is smaller than the thickness of peripheral area ISp, so that back cover FD has a hollowed appearance from the thermoelectric module side. Peripheral area ISp is intended to be fixed to case middle CR, it thus includes mounting holes FX and must be solid, hence its thickness. Conversely, on the thermoelectric module side, central area ISc faces branches BC of support element SP. Since air is a better insulator than any material used to make insulating part IS, it is preferable to moves central area ISc away from branches BC to increase insulation. The empty volume could alternatively be filled with a better insulating gas than air, such as argon. It is noted that the volume could alternatively be filled with polyurethane foam. Further, to increase said volume and thereby improve insulation, it is advantageous to hollow out plate PT as well, as seen in FIGS. 3 and 10.

Figure 8:
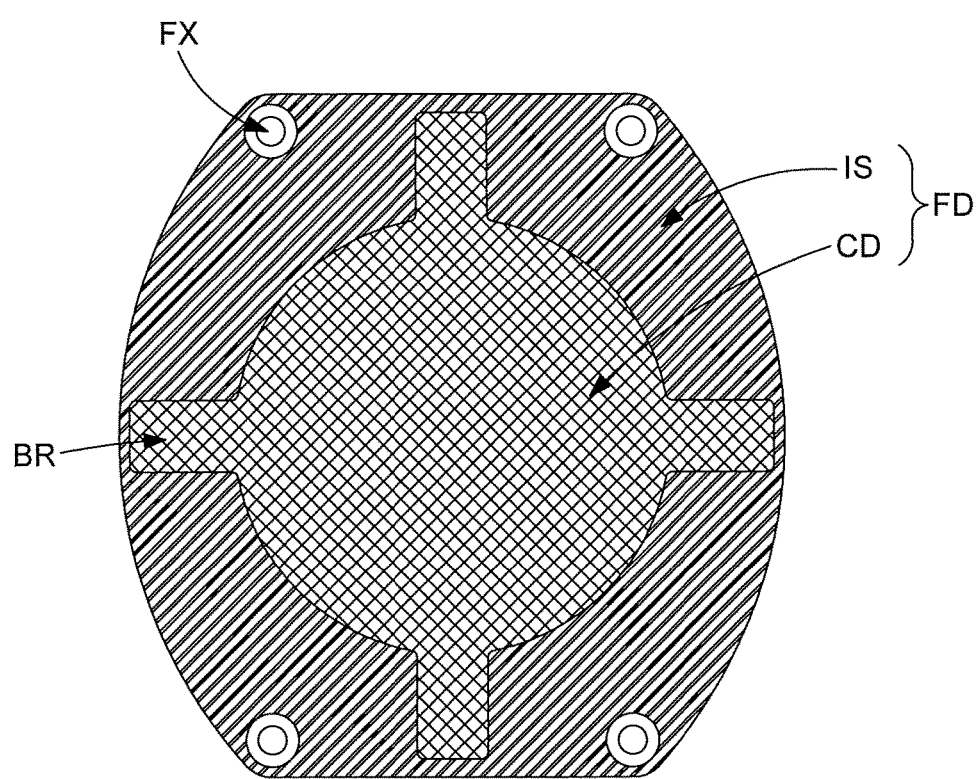
FIG. 8 represents a back cover of a thermoelectric watch according to one embodiment of the invention, seen from the wrist side.
Figure 9:
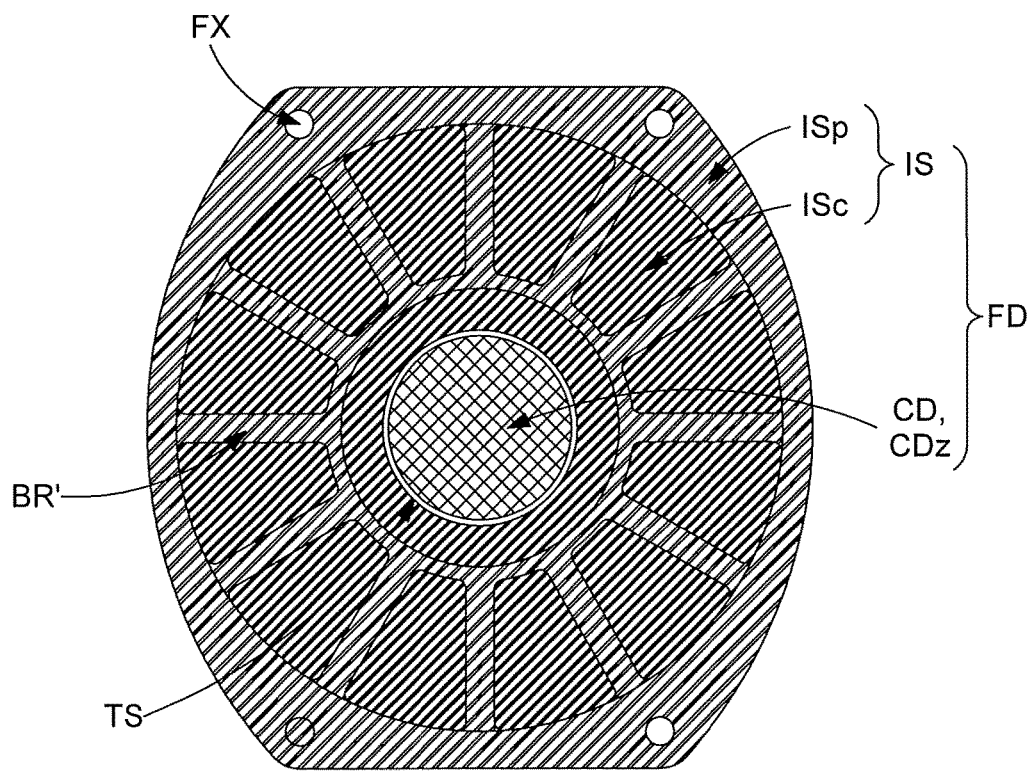
FIG. 9 represents a back cover of a thermoelectric watch according to one embodiment of the invention, seen from the thermoelectric module side.

FIG. 8 shows an alternative form of conductive part CD, on the wrist side. In this embodiment, conductive part CD includes stiffened arms BR in order to mechanically strengthen said central area ISc, in particular when the latter is made fragile by its small thickness. Advantageously, these arms BR extend radially and cover peripheral area ISp of insulating part IS. The mechanical reinforcement could also be formed in central area ISc itself, by mounting, on central area ISc, arms BR' extending radially over the thermoelectric module side. FIG. 9 represents such an embodiment.

Figure 11:
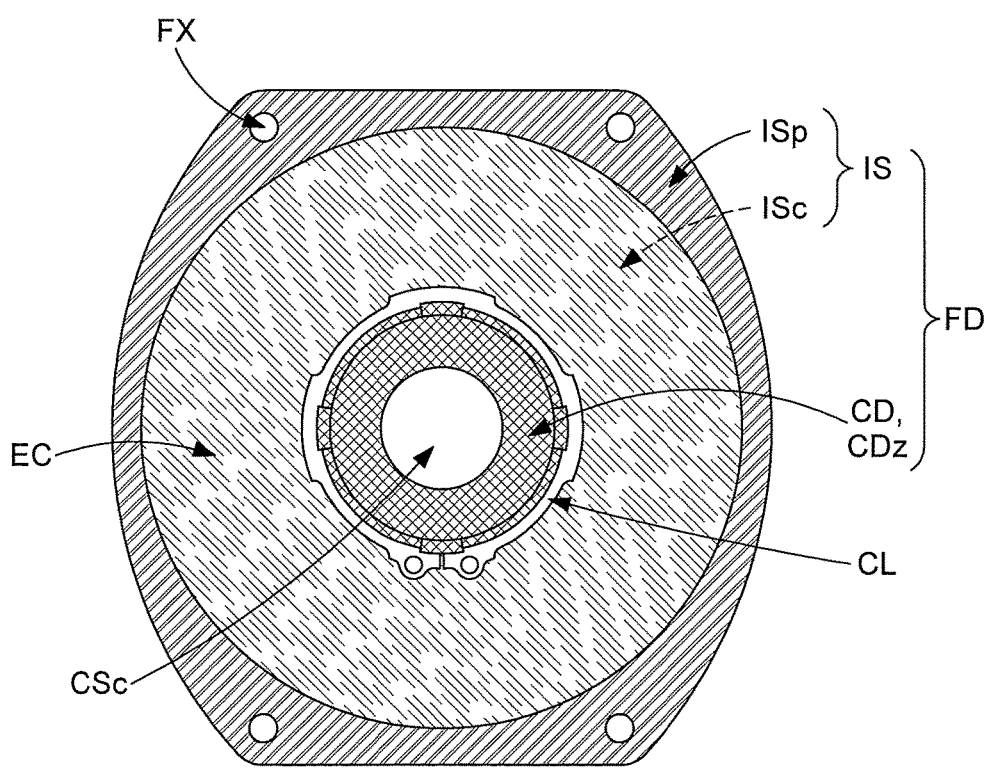
FIG. 11 represents a back cover of a thermoelectric watch according to one embodiment of the invention, seen from the thermoelectric module side, surmounted by a heat radiation screen.

Further, in an embodiment illustrated in FIG. 11, watch PH has a heat radiation screen EC covering central area ISc of insulating part IS on the thermoelectric module side, and preventing thermal exchanges by radiation between case back FD and support element SP. Heat screen EC is advantageously made in the same manner as survival blankets, with the aluminium side turned towards the support element, and the gold side (made of plastic) hidden. Screen EC is bonded or clamped on its periphery between back cover FD and case middle CR. Given that heat screen EC has a metal face, it also acts as a Faraday screen in order to protect watch PH against any electrostatic discharge. Heat radiation screen EC could alternatively be made by evaporation of aluminium or by applying a spray over central area ISc of insulating part IS, on the thermoelectric module side.

Of course, this invention is not limited to the illustrated example but is capable of various variants and alterations that will appear to those skilled in the art.

The invention claimed is:

1. A thermoelectric watch comprising:
   a back cover;
   a case middle;
   a thermoelectric module including a hot plate and a cold plate positioned above the hot plate, the hot plate and the cold plate are connected by semiconductor pillars extending between the hot plate and the cold plate, wherein the hot plate is thermally connected to the back cover of the watch; and
   a support element includes at least two branches and a metal ring fixed to the case middle, the at least two branches being connected to the metal ring at an outer end of each of the at least two branches, the at least two branches connect at an inner end to form a common end, the cold plate is thermally connected to the case middle of the watch via the support element, the cold plate of the thermoelectric module being held directly under the common end of the at least two branches, and the at least two branches are flexible to absorb shocks to the case middle propagating to the thermoelectric module,
   wherein a bearing formed of glass reinforced elastomer is placed at an interface between the back cover and the thermoelectric module.

2. The thermoelectric watch according to claim 1, wherein each of the at least two branches are of a same length.

3. A thermoelectric watch, comprising:
   a back cover;
   a case middle;
   a thermoelectric module including a hot plate and a cold plate positioned above the hot plate, the hot plate and the cold plate are connected by semiconductor pillars extending between the hot plate and the cold plate, wherein the hot plate is thermally connected to the back cover of the watch; and
   a support element includes at least two branches and a metal ring fixed to the case middle, the at least two branches being connected to the metal ring at an outer end of each of the at least two branches, the at least two branches connect at an inner end to form a common end, the cold plate is thermally connected to the case middle of the watch via the support element, the cold plate of the thermoelectric module being held under the common end of the at least two branches, and the at least two branches are flexible to absorb shocks to the case middle propagating to the thermoelectric module,
   wherein a bearing formed of glass reinforced elastomer is placed at an interface between the thermoelectric module and the support element.

4. The thermoelectric watch according to claim 1, wherein the back cover comprises:
   a conductive part made of thermally conductive material arranged to be in contact with a wrist when the watch is worn and to direct a heat flux from the wrist towards the thermoelectric module,
   an insulating part made of thermally insulating material arranged to limit heat fluxes between the wrist and case middle of the watch that do not pass through thermoelectric module.

5. The thermoelectric watch according to claim 4, wherein the insulating part includes a central area and a peripheral area, the central area having a smaller thickness than the peripheral area.

6. The thermoelectric watch according to claim 5, wherein the central area of the insulating part, on the thermoelectric module side, is surmounted by arms in order to mechanically reinforce said central area.

7. The thermoelectric watch according to claim 5, wherein the conductive part, on the wrist side, includes arms locally covering the central area of the insulating part.

8. The thermoelectric watch according to claim 4, wherein the watch includes a heat radiation screen covering a central area of the insulating part, on the thermoelectric module side.

9. The thermoelectric watch according to claim 1, wherein the mechanical stiffness K of the support element is within a range of between 0.15 N/mm and 2800 N/mm.

10. The thermoelectric watch according to claim 1, wherein the thermal conductance C of the support element is within a range of between 6.7 and 840 mW/K.

11. The thermoelectric watch according to claim 1, wherein the support element includes graphite-based films bonded to the at least two branches and the films have thermal conductivities of at least 400 W/m/K.

12. The thermoelectric watch according to claim 1, wherein the at least two branches are made of aluminium.

13. The thermoelectric watch according to claim 1, wherein the mechanical stiffness K of the support element is within a range of between 12.8 N/mm and 104.8 N/mm.

14. The thermoelectric watch according to claim 1, wherein the thermal conductance C of the support element is within a range of between 47 and 198 mW/K.

15. The thermoelectric watch according to claim 1, wherein the cold plate of the thermoelectric module is in direct contact with the common end of the at least two branches.

16. The thermoelectric watch according to claim 3, wherein each of the at least two branches are of a same length.

17. The thermoelectric watch according to claim 3, wherein the back cover comprises:
   a conductive part made of thermally conductive material arranged to be in contact with a wrist when the watch is worn and to direct a heat flux from the wrist towards the thermoelectric module,
   an insulating part made of thermally insulating material arranged to limit heat fluxes between the wrist and case middle of the watch that do not pass through thermoelectric module.

18. The thermoelectric watch according to claim 17, wherein the insulating part includes a central area and a peripheral area, the central area having a smaller thickness than the peripheral area.

19. The thermoelectric watch according to claim 18, wherein the central area of the insulating part, on the thermoelectric module side, is surmounted by arms in order to mechanically reinforce said central area.

20. The thermoelectric watch according to claim 18, wherein the conductive part, on the wrist side, includes arms locally covering the central area of the insulating part.

* * * * *